(12) United States Patent
Nolan

(10) Patent No.: US 6,653,878 B2
(45) Date of Patent: Nov. 25, 2003

(54) LOW-POWER OUTPUT CONTROLLED CIRCUIT

(75) Inventor: James B. Nolan, Chandler, AZ (US)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 09/961,517

(22) Filed: Sep. 24, 2001

(65) Prior Publication Data

US 2003/0058005 A1 Mar. 27, 2003

(51) Int. Cl.[7] ................................................ H03K 5/12
(52) U.S. Cl. ..................... 327/170; 327/124; 327/108
(58) Field of Search ................................ 327/108, 170, 327/111, 544, 590, 124

(56) References Cited

U.S. PATENT DOCUMENTS

| | | | | |
|---|---|---|---|---|
| 3,713,115 A | * | 1/1973 | Duben | 327/222 |
| 4,612,457 A | * | 9/1986 | Prater | 326/30 |
| 4,855,622 A | * | 8/1989 | Johnson | 326/19 |
| 5,311,076 A | * | 5/1994 | Park et al. | 326/21 |
| 5,783,964 A | * | 7/1998 | Eitan | 327/408 |
| 5,796,313 A | * | 8/1998 | Eitan | 326/27 |
| 5,945,844 A | * | 8/1999 | Vo | 326/71 |
| 6,118,267 A | * | 9/2000 | Eitan et al. | 323/364 |
| 6,316,992 B1 | * | 11/2001 | Miao et al. | 327/124 |
| 6,362,683 B1 | * | 3/2002 | Miao et al. | 330/10 |
| 6,380,761 B1 | * | 4/2002 | Annema | 326/68 |
| 6,414,521 B1 | * | 7/2002 | Potter et al. | 327/51 |
| 6,448,838 B1 | * | 9/2002 | Heim et al. | 327/365 |

* cited by examiner

Primary Examiner—Timothy P. Callahan
Assistant Examiner—Cassandra Cox
(74) Attorney, Agent, or Firm—Baker Botts L.L.P.

(57) ABSTRACT

An output buffer, a slew-rate control circuit, a break-before-make circuit, and a current limited input amplifier are connected as a digital output driver. This provides a simple apparatus and method of switching current control and slew-rate control that limits power consumption of the digital output driver. To further minimize switching current, capacitors may be added to the break-before-make circuit. A comparator input circuit may be connected to the current limited input amplifier to form a comparator having a low-power-consuming digital output.

59 Claims, 4 Drawing Sheets

LOW-POWER OUTPUT CONTROLLED CIRCUIT

FIELD OF THE INVENTION

The present invention relates generally to output circuits, and more particularly to a method and apparatus for a comparator output controlled circuit.

BACKGROUND OF THE INVENTION TECHNOLOGY

A comparator is a circuit that senses the difference between its two inputs and changes its output state depending on which of the inputs is higher in voltage. In CMOS (Complementary Metal Oxide Semiconductor) technology, as the comparator output makes a transition, there is current that flows for a short time when both NMOS (Negative Channel MOS) and PMOS (Positive Channel MOS) transistors are on. During a change in output state, a comparator, or any other analog or digital circuit, may conduct significant current from the power source.

Electronic circuits are being pressed into operation at lower supply voltages and currents. For some very low power comparators, the switching or transition current may be large relative to the static quiescent current of the comparator. In low-power applications, the DC switching current is conducted for an especially long period of time, because of the slow propagation delay of an output state change. Also because the comparator has a large output driver to drive a large load, the DC switching current (magnitude) can become quite large. A high slew rate occurs in existing technologies as comparator output drivers change the output from one state to the other. Thus, in very low-power applications, it would be desirable to limit the switching current and the slew rate of the comparator output, in order to limit power consumption.

Existing technologies' attempts to implement output control have not offered solutions relevant to the very low-power environment. Output control circuits have been designed for high-speed buffers, implementing multiple small output drivers connected in parallel and staging their turn-on times in a staggered way. These circuits are to reduce ground/supply bounce primarily. However, these circuits fail to address the problems of excessive power consumption and slew rate.

Other existing technologies' output control circuits are slew-rate-limited, but not very low-power. One example implements two parallel output drivers, one slew-rate-limited and the other strong for DC performance. A strongly-switching output driver is disadvantageous for very low power applications because of the high slew rate. A high slew rate of the output driver may cause an increase in the total current used in the system because it may lead to ground or supply bounce, and charge/discharge of $V_{dd}$-$V_{ss}$ capacitance either on or off chip, e.g., decoupling capacitors. A high slew rate output driver may also couple noise into sensitive high impedance input nodes that may be present in very low power circuits. For the aforementioned reasons a slower, controlled (current-limited) slew rate is preferred for very low power circuits. However, existing technologies' low power drivers, which are slew-rate-limited, may be ineffective in a very-low-power application because, at least in part, their slew-rate control circuit does not use feedback to adjust itself to achieve optimal slew-rate.

Existing technologies' output control circuits do limit "crow-bar" current, i.e. Class-A CMOS current; for existing technologies' purposes, a limited conduction of crow-bar current is acceptable. For very low-power applications, no crow-bar current ought to be conducted. None of the existing technologies' output control circuits substantially eliminate crow-bar current.

SUMMARY OF THE INVENTION

The invention overcomes the above-identified problems as well as other shortcomings and deficiencies of existing technologies by providing a method and apparatus for a digital output driver where low power operation is desirable.

In accordance with an exemplary embodiment of the present invention, a low-power digital output (logic low or logic high output) driver having a control circuit comprising a break-before-make circuit and an output buffer connected to the break-before-make circuit, the output buffer adapted for outputting digital logic levels.

In accordance with another exemplary embodiment of the present invention, a low-power digital output (logic low or logic high output) driver having a control circuit comprising a break-before-make circuit, a slew-rate control circuit connected to the break-before-make circuit, and an output buffer connected to the slew-rate control circuit, the output buffer adapted for outputting digital logic levels. The slew-rate control circuit comprises a first capacitor, a second capacitor connected to the first capacitor, and a feedback element connected to the first capacitor and the second capacitor.

In accordance with a further exemplary embodiment of the present invention, a low-power digital output (logic low or logic high output) driver having a control circuit comprising a current limited input amplifier with low output impedance and minimal switching current, a break-before-make circuit connected to the current limited input amplifier, and an output buffer connected to the break-before-make circuit, the output buffer adapted for outputting digital logic levels.

In accordance with still a further exemplary embodiment of the present invention, a low-power digital output (logic low or logic high output) driver having a control circuit comprising a current limited input amplifier and an output buffer adapted for outputting digital logic levels, wherein the output buffer is connected to the current limited input amplifier.

In accordance with yet a further exemplary embodiment of the present invention, a low-power digital output (logic low or logic high output) driver having a control circuit comprising a current limited input amplifier, a slew-rate control circuit comprising a first capacitor, a second capacitor connected to the first capacitor, and a feedback element connected to the first capacitor and the second capacitor, wherein the slew-rate control circuit is connected to the current limited input amplifier, and an output buffer adapted for outputting digital logic levels, wherein the output buffer is connected to the slew-rate control circuit.

In accordance with yet another exemplary embodiment of the present invention, a low-power digital output (logic low or logic high output) driver having a control circuit comprising a current limited input amplifier with low output impedance and minimal switching current, a break-before-make circuit connected to the current limited input amplifier, a slew-rate control circuit connected to the break-before-make circuit, and an output buffer connected to the slew-rate control circuit, the output buffer adapted for outputting digital logic levels. The slew-rate control circuit comprises a first capacitor, a second capacitor connected to the first capacitor, and a feedback element connected to the first capacitor and the second capacitor.

In addition, the present invention is also directed to methods of operation for low-power output control comprising the steps of delaying a state change of an output buffer of the circuit with a break-before-make circuit and outputting digital logic levels with the output buffer, wherein the output buffer is connected to the break-before-make circuit.

The present invention is further directed to methods of operation for low-power output control comprising the steps of amplifying an input bias of the circuit with a current limited input amplifier and outputting digital logic levels with the output buffer, wherein the output buffer is connected to the current limited input amplifier.

An advantage of the present invention is that it requires few components, none of which consume much power. Another advantage is that the method of slew-rate control presented in this invention uses feedback to regulate the slew rate of the output stage. Thus, the slew-rate control method is more precise and consistent than existing technologies' methods, and is applicable to very low power circuits.

A further advantage of the present invention is that it conducts substantially no crow-bar current and minimal switching current, essential aspects for very low power design.

Features and advantages of the invention will be apparent from the following description of the embodiments, given for the purpose of disclosure and taken in conjunction with the accompanying drawing.

BRIEF DESCRIPTION OF THE DRAWING

A more complete understanding of the present disclosure and advantages thereof may be acquired by referring to the following description taken in conjunction with the accompanying drawing, wherein.

Figure 1A:
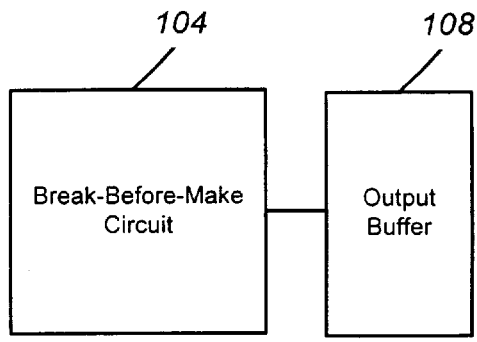
FIG. 1 illustrates block diagrams of six exemplary embodiments of the present invention.
Figure 1B:
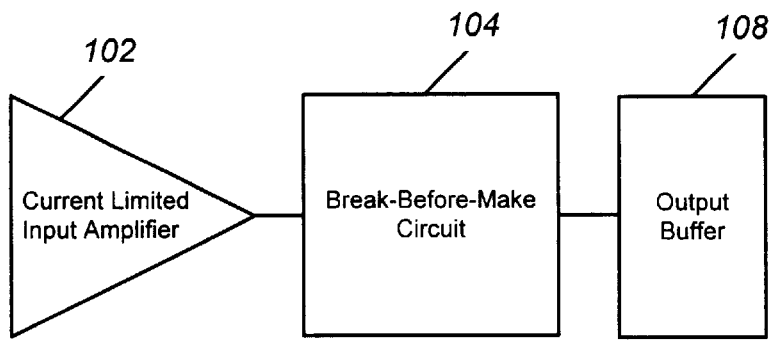
Figure 1C:
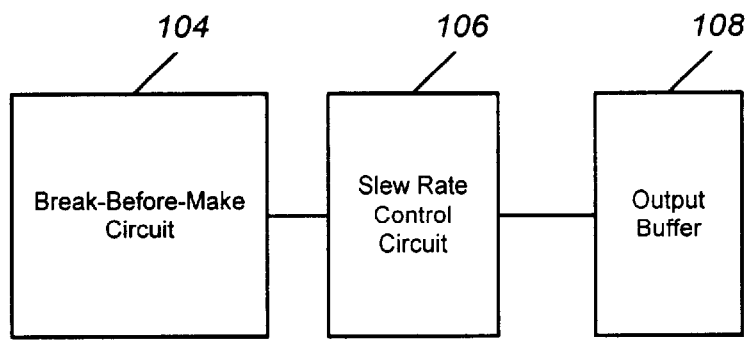
Figure 1D:
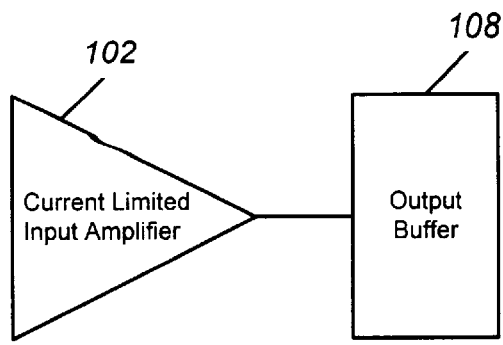
Figure 1E:
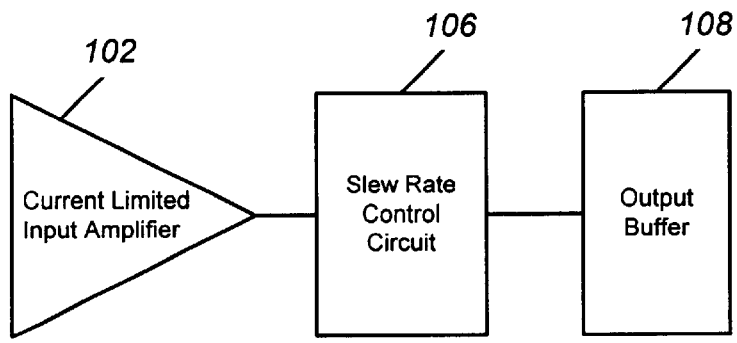

While the present invention is susceptible to various modifications and alternative forms, specific exemplary embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF A SPECIFIC EMBODIMENT

Referring now to the drawings, the details of exemplary embodiments of the present invention are schematically illustrated. Like elements in the drawing will be represented by like numbers, and similar elements will be represented by like numbers with a different lower case letter suffix.

Referring to FIG. 1, illustrated are block diagrams of six exemplary embodiments of the present invention. In FIG. 1a, break-before-make circuit 104 is connected to output buffer 108. In FIG. 1b, current limited input amplifier 102 is connected to break-before-make circuit 104. Break-before-make circuit 104 is connected to output buffer 108. In FIG. 1c, slew rate control circuit 106 is connected between break-before-make circuit 104 and output buffer 108. In FIG. 1d, current limited input amplifier 102 is connected to output buffer 108. In FIG. 1e, current limited input amplifier 102 is connected to slew rate control circuit 106. Slew rate control circuit 106 is connected to output buffer 108. In FIG. 1f, current limited input amplifier 102 is connected to break-before-make circuit 104. Break-before-make circuit 104 is connected to slew rate control circuit 106. Slew rate control circuit 106 is connected to output buffer 108.

Each one of the six embodiments of FIG. 1 achieves low-power control of the output buffer 108.

Figure 1F:
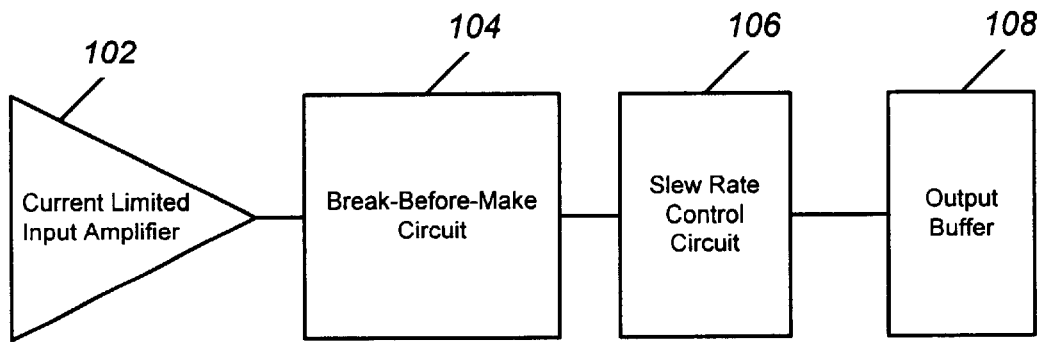
Figure 2:
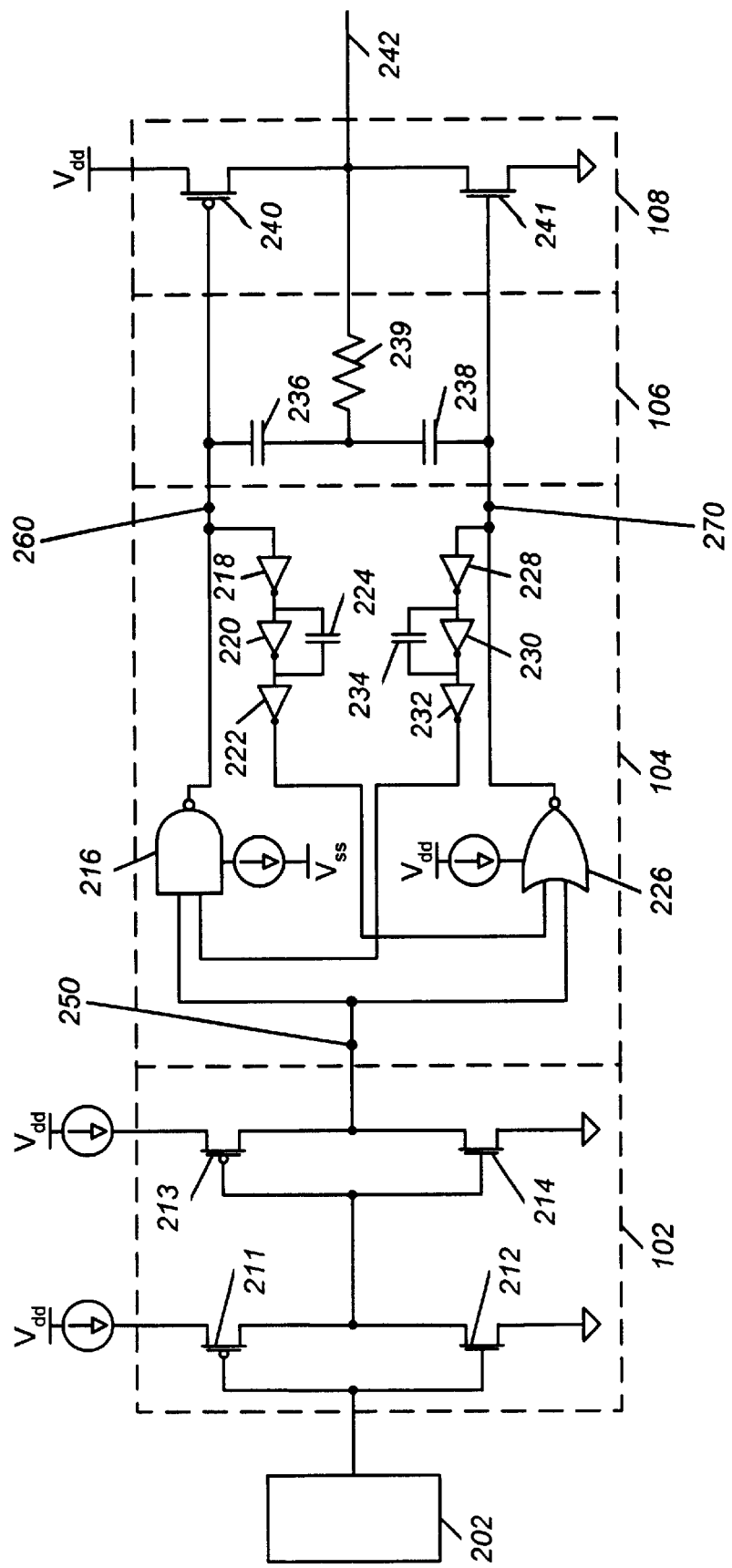
FIG. 2 illustrates a schematic diagram of a low-power output controlled circuit of the present invention.

Referring to FIG. 2, depicted is a schematic diagram of a digital output and control circuit according to the exemplary embodiment illustrated in FIG. 1f. The digital output may be used with any digital or analog circuit function having a digital output, e.g., a comparator. For example, but not limited to the following, a comparator 202 is connected to the first stage of the digital output controlled circuit, the current limited input amplifier 102. Current limited input amplifier 102 comprises PMOS transistors 211 and 213 and NMOS transistors 212 and 214. Transistors 211 and 212, and transistors 213 and 214, are connected, respectively, to form two CMOS inverters. Because CMOS inverters are driven by current sources, the transition or switching current is limited to the value of the current sources. Pairs of transistors turn on and off simultaneously. For instance, when the pair of transistors 211 and 214 is turned on, the pair of transistors 212 and 213 is turned off, and vice versa. Thus, one pair is always turned off, substantially eliminating quiescent current and providing low output impedance in both states of an output measured at node 250.

Current limited input amplifier 102 may be connected to break-before-make circuit 104, which comprises NAND gate 216, inverters 218, 220, 222, 228, 230, and 232, NOR gate 226, and capacitors 224 and 234. NAND gate 216 is connected to current limited input amplifier 102. Inverter 218 is connected to NAND gate 216 and slew rate control circuit 106. Inverter 220 and capacitor 224 are connected to inverter 218. Inverter 222 is connected to inverter 220 and capacitor 224. NOR gate 226 is connected to inverter 222 and current limited input amplifier 102. Inverter 228 is connected to NOR gate 226 and slew rate control circuit 106. Inverter 230 and capacitor 234 are connected to inverter 228. Inverter 232 is connected to inverter 230 and capacitor 234. NAND gate 216 is connected to inverter 232. Inverters 218, 220, 222, 228, 230, and 232, NAND gate 216, and NOR gate 226 preferably use a controlled bias (similar to the controlled bias used with the inverters 212 and 214) to limit crow-bar currents.

Break-before-make circuit 104 provides non-overlap delay during a state transition of output 242. The delay occurs between the time that a PMOS driver 240 turns off and an NMOS driver 241 turns on or between the time that the NMOS driver 241 turns off and the PMOS driver 240 turns on. Capacitors 224 and 234 may be adjusted to affect the length of the delay. Larger capacitors cause a longer delay.

Break-before-make circuit 104 may be connected to slew rate control circuit 106. The slew rate control circuit 106 comprises capacitors 236 and 238 and feedback resistor 239 as well as current sources available from NAND gate 216 and NOR gate 226. The NAND gate 216 has a current source to $V_{ss}$ in order to discharge capacitor 236 and turn on PMOS driver 240 in a slew-limited manner.

Feedback resistor 239 protects capacitors 236 and 238 from electrostatic discharge (ESD) and provides a negative feedback path from the output 242 to the slew rate control circuit 106. This feedback acts to provide a more precise and consistent slew rate, regardless of power supply voltage or external load. In an exemplary embodiment, resistor 239 has a value of about 1 kiloOhm and the slew rate is about 5 Volts per microsecond.

The slew rate is approximately equal to the current from either the NAND gate 216 or NOR gate 226 divided by the capacitance 236 or 238, respectively. This ensures a smooth output transition, reducing switching current and minimizing power supply noise. In an exemplary embodiment, the values of capacitors 236 and 238 may range from about 1 picoFarad to about 2 picoFarads.

Slew rate control circuit 106, which prevents drivers 240 and 241 from switching the state of output 242 too quickly, may be connected to output buffer 108 which comprises PMOS driver 240 and NMOS driver 241 and has the output 242.

Without the delay imposed by the break-before-make circuit 104 and the control imposed by the slew-rate control circuit 106, PMOS driver 240 and NMOS driver 241 would be allowed to switch freely, causing noise and ringing, wasting power, and introducing transients. The present invention is tailored for a very low power application because it prevents the wasting of power caused by the free switching of drivers 240 and 241.

As depicted in FIGS. 1a–1f, any combination of current limited input amplifier 102, break-before-make circuit 104, and slew rate control circuit 106 may be utilized for conserving power, according to the present invention.

Figure 3:
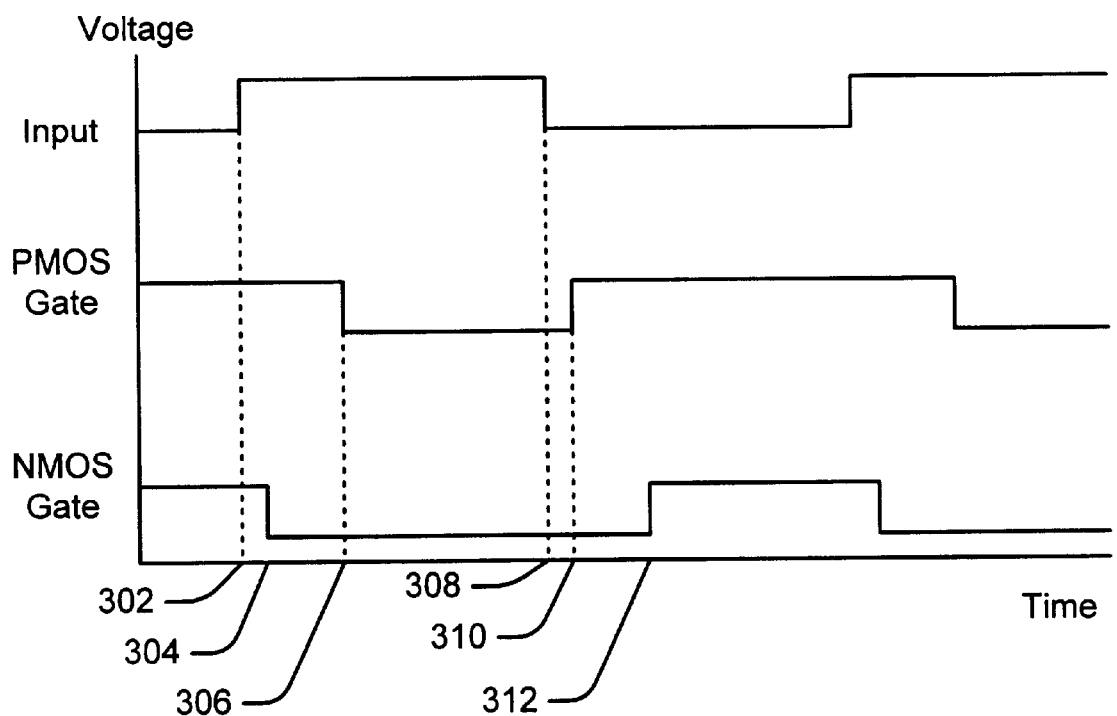
FIG. 3 illustrates a timing diagram of the digital input and output waveforms of the break-before-make circuit.

Referring to FIG. 3, depicted is a timing diagram of the digital input and output waveforms of the break-before-make circuit 104. The voltage waveform labeled "Input" is measured at node 250 (see FIG. 2); the voltage waveform labeled "PMOS Gate" is measured at node 260; and the voltage waveform labeled "NMOS Gate" is measured at node 270. Comparing the waveforms shows that PMOS transistor 240 and NMOS transistor 241 are never turned on at the same time, because the "PMOS Gate" is not in a LOW state at the same time as the "NMOS Gate" is in a HIGH state.

In an initial state, Input is LOW, PMOS Gate is HIGH, and NMOS Gate is HIGH. Thus, PMOS transistor 240 is turned off and NMOS transistor 241 is turned on. At time 302, Input is changed to HIGH. At time 304, the output of NOR gate 226 changes to LOW, as does NMOS Gate. This causes NMOS transistor 241 to turn off. At time 306, after propagation delays caused by inverters 228, 230, and 232, capacitor 234, and NAND gate 216, the output of NAND gate 216 changes to LOW, as does PMOS Gate. This causes PMOS transistor 240 to turn on. Thus, when Input changes from LOW to HIGH, it does not cause transistors 240 and 241 to be turned on at the same time.

Next, at time 308, Input is changed to LOW. At time 310, the output of NAND gate 216 changes to HIGH, as does PMOS Gate. This causes PMOS transistor 240 to turn off. At time 312, after propagation delays caused by inverters 218, 220, and 222, capacitor 224, and NOR gate 226, the output of NOR gate 226 changes to HIGH, as does NMOS Gate. This causes NMOS transistor 241 to turn on. Thus, when Input changes from HIGH to LOW, it does not cause transistors 240 and 241 to be turned on at the same time. In both cases of Input change, switching current is substantially eliminated.

The invention, therefore, is well adapted to carry out the objects and attain the ends and advantages mentioned, as well as others inherent therein. While the invention has been depicted, described, and is defined by reference to exemplary embodiments of the invention, such a reference does not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A low-power output controlled circuit, comprising:
   a break-before-make circuit, wherein the break-before-make circuit comprises a first inverter connected to a NAND gate, a second inverter connected to the first inverter, a third inverter connected to the second inverter, a NOR gate connected to the third inverter, a fourth inverter connected to the NOR gate, a fifth inverter connected to the fourth inverter, and an sixth inverter connected to the fifth inverter, and the NAND gate is connected to the sixth inverter; and
   an output buffer adapted for outputting digital logic levels, wherein the output buffer is connected to the break-before-make circuit.

2. The low-power output controlled circuit of claim 1, wherein the break-before-make circuit further comprises a first capacitor connected in parallel with the second inverter and a second capacitor connected in parallel with the fifth inverter.

3. The low-power output controlled circuit of claim 1, wherein the output buffer comprises a PMOS driver connected to an NMOS driver.

4. The low-power output controlled circuit of claim 1, further comprising:
   a slew-rate control circuit comprising a first capacitor, a second capacitor connected to the first capacitor, and a feedback element connected to the first capacitor and the second capacitor, wherein the slew-rate control circuit is connected between the break-before-make circuit and the output buffer.

5. The low-power output controlled circuit of claim 4, wherein the claim feedback element of the slew-rate control circuit is a resistor.

6. The low-power output controlled circuit of claim 1, further comprising a current limited input amplifier connected to the break-before-make circuit.

7. The low-power output controlled circuit of claim 6, wherein the current limited input amplifier comprises a first CMOS inverter having an input and an output and a second CMOS inverter having an input and an output, and the output of the first CMOS inverter is connected to the input of the second CMOS inverter.

8. The low-power output controlled circuit of claim 1, wherein the break-before-make circuit is connected to a comparator.

9. A low-power output controlled circuit, comprising:
   a break-before-make circuit;
   a slew-rate control circuit comprising a first capacitor, a second capacitor connected to the first capacitor, and a feedback element connected to the first capacitor and the second capacitor, wherein the slew-rate control circuit is connected between the break-before-make circuit and the output buffer; and an output buffer adapted for outputting digital logic levels, wherein the output buffer is connected to the slew-rate control circuit.

10. The low-power output controlled circuit of claim 9, wherein the break-before-make circuit comprises a first inverter connected to a NAND gate, a second inverter connected to the first inverter, a third inverter connected to the second inverter, a NOR gate connected to the third inverter, a fourth inverter connected to the NOR gate, a fifth inverter connected to the fourth inverter, and an sixth inverter connected to the fifth inverter, and the NAND gate is connected to the sixth inverter.

11. The low-power output controlled circuit of claim 10, wherein the break-before-make circuit further comprises a third capacitor connected in parallel with the second inverter and a fourth capacitor connected in parallel with the fifth inverter.

12. The low-power output controlled circuit of claim 9, wherein the output buffer comprises a PMOS driver connected to an NMOS driver.

13. The low-power output controlled circuit of claim 9, wherein the feedback element of the slew-rate control circuit is a resistor.

14. The low-power output controlled circuit of claim 9, further comprising a current limited input amplifier connected to the break-before-make circuit.

15. The low-power output controlled circuit of claim 14, wherein the current limited input amplifier comprises a first CMOS inverter having an input and an output and a second CMOS inverter having an input and an output, and the output of the first CMOS inverter is connected to the input of the second CMOS inverter.

16. The low-power output controlled circuit of claim 9, wherein the break-before-make circuit is connected to a comparator.

17. A low-power output controlled circuit, comprising:
a current limited input amplifier;
a break-before-make circuit connected to the current limited input amplifiers wherein the break-before-make circuit comprises a first inverter connected to a NAND gate, a second inverter connected to the first inverter, a third inverter connected to the second inverter, a NOR sate connected to the third inverter a fourth inverter connected to the NOR sate, a fifth inverter connected to the fourth inverter, and an sixth inverter connected to the fifth inverter, and the NAND sate is connected to the sixth inverter; and
an output buffer adapted for outputting digital logic levels, wherein the output buffer is connected to the break-before-make circuit.

18. The low-power output controlled circuit of claim 17, wherein the break-before-make circuit further comprises a first capacitor connected in parallel with the second inverter and a second capacitor connected in parallel with the fifth inverter.

19. The low-power output controlled circuit of claim 17, wherein the output buffer comprises a PMOS driver connected to an NMOS driver.

20. The low-power output controlled circuit of claim 17, further comprising:
a slew-rate control circuit comprising a first capacitor, a second capacitor connected to the first capacitor, and a feedback element connected to the first capacitor and the second capacitor, wherein the slew-rate control circuit is connected between the break-before-make circuit and the output buffer.

21. The low-power output controlled circuit of claim 20, wherein the feedback element of the slew-rate control circuit is a resistor.

22. The low-power output controlled circuit of claim 17, wherein the current limited input amplifier comprises a first CMOS inverter having an input and an output and a second CMOS inverter having an input and an output, and the output of the first CMOS inverter is connected to the input of the second CMOS inverter.

23. The low-power output controlled circuit of claim 17, wherein the current limited input amplifier is connected to a comparator.

24. A low-power output controlled circuit, comprising:
a current limited input amplifier;
a break-before-make circuit connected to the current limited input amplifier;
a slew-rate control circuit comprising a first capacitor, a second capacitor connected to the first capacitor, and a feedback element connected to the first capacitor and the second capacitor, wherein the slew-rate control circuit is connected to the break-before-make circuit; and
an output buffer adapted for outputting digital logic levels, wherein the output buffer is connected to the slew-rate control circuit.

25. The low-power output controlled circuit of claim 24, wherein the break-before-make circuit comprises a first inverter connected to a NAND gate, a second inverter connected to the first inverter, a third inverter connected to the second inverter, a NOR gate connected to the third inverter, a fourth inverter connected to the NOR gate, a fifth inverter connected to the fourth inverter, and an sixth inverter connected to the fifth inverter, and the NAND gate is connected to the sixth inverter.

26. The low-power output controlled circuit of claim 25, wherein the break-before-make circuit further comprises a third capacitor connected in parallel with the second inverter and a fourth capacitor connected in parallel with the fifth inverter.

27. The low-power output controlled circuit of claim 24, wherein the output buffer comprises a PMOS driver connected to an NMOS driver.

28. The low-power output controlled circuit of claim 24, wherein the feedback element of the slew-rate control circuit is a resistor.

29. The low-power output controlled circuit of claim 24, wherein the current limited input amplifier comprises a first CMOS inverter having an input and an output and a second CMOS inverter having an input and an output, and the output of the first CMOS inverter is connected to the input of the second CMOS inverter.

30. The low-power output controlled circuit of claim 24, wherein the current limited input amplifier is connected to a comparator.

31. A low-power output controlled circuit, comprising:
a current limited input amplifier;
an output buffer adapted for outputting digital logic levels; and
a break-before-make circuit connected between the current limited input amplifier and the output buffer, wherein the break-before-make circuit comprises a first inverter connected to a NAND sate, a second inverter connected to the first inverter, a third inverter connected to the second inverter, a NOR sate connected to the third inverter, a fourth inverter connected to the NOR sate, a fifth inverter connected to the fourth inverter, and an sixth inverter connected to the fifth inverter, and the NAND sate is connected to the sixth inverter.

32. The low-power output controlled circuit of claim 31, wherein the break-before-make circuit further comprises a first capacitor connected in parallel with the second inverter and a second capacitor connected in parallel with the fifth inverter.

33. The low-power output controlled circuit of claim 31, wherein the output buffer comprises a PMOS driver connected to an NMOS driver.

34. The low-power output controlled circuit of claim 31, further comprising:

a slew-rate control circuit comprising a first capacitor, a second capacitor connected to the first capacitor, and a feedback connected to the first capacitor and the second capacitor, wherein the slew-rate control circuit is connected between the current limited input amplifier and the output buffer.

35. The low-power output controlled circuit of claim 34, wherein the feedback element of the slew-rate control circuit is a resistor.

36. The low-power output controlled circuit of claim 34, wherein the current limited input amplifier comprises a first CMOS inverter having an input and an output and a second CMOS inverter having an input and an output, and the output of the first CMOS inverter is connected to the input of the second CMOS inverter.

37. The low-power output controlled circuit of claim 31, wherein the current limited input amplifier is connected to a comparator.

38. A low-power output controlled circuit, comprising:

a current limited input amplifier;

a slew-rate control circuit comprising a first capacitor, a second capacitor connected to the first capacitor, and a feedback element connected to the first capacitor and the second capacitor, wherein the slew-rate control circuit is connected to the current limited input amplifier; and an output buffer adapted for outputting digital logic levels, wherein the output buffer is connected to the slew-rate control circuit.

39. The low-power output controlled circuit of claim 38, further comprising a break-before-make circuit connected between the current limited input amplifier and the slew-rate control circuit.

40. The low-power output controlled circuit of claim 39, wherein the break-before-make circuit comprises a first inverter connected to a NAND gate, a second inverter connected to the first inverter, a third inverter connected to the second inverter, a NOR gate connected to the third inverter, a fourth inverter connected to the NOR gate, a fifth inverter connected to the fourth inverter, and an sixth inverter connected to the fifth inverter, and the NAND gate is connected to the sixth inverter.

41. The low-power output controlled circuit of claim 40, wherein the break-before-make circuit further comprises a first capacitor connected in parallel with the second inverter and a second capacitor connected in parallel with the fifth inverter.

42. The low-power output controlled circuit of claim 38, wherein the output buffer comprises a PMOS driver connected to an NMOS driver.

43. The low-power output controlled circuit of claim 38, wherein the feedback element of the slew-rate control circuit is a resistor.

44. The low-power output controlled circuit of claim 38, wherein the current limited input amplifier comprises a first CMOS inverter having an input and an output and a second CMOS inverter having an input and an output, and the output of the first CMOS inverter is connected to the input of the second CMOS inverter.

45. The low-power output controlled circuit of claim 38, wherein the current limited input amplifier is connected to a comparator.

46. A method for low-power output control of a circuit, comprising the steps of:

delaying a state change of an output buffer of the circuit with a break-before-make circuit, wherein the break-before-make circuit comprises a first inverter connected to a NAND sate, a second inverter connected to the first inverter, a third inverter connected to the second inverter, a NOR gate connected to the third inverter, a fourth inverter connected to the NOR gate, a fifth inverter connected to the fourth inverter, and an sixth inverter connected to the fifth inverter, and the NAND gate is connected to the sixth inverter;

amplifying an input bias of the circuit with a current limited input amplifier, wherein the current limited input amplifier is connected to the break-before-make circuit; and outputting digital logic levels with the output buffer, wherein the output buffer is connected to the break-before-make circuit.

47. The method for low-power output control of a circuit of claim 46, further comprising the step of controlling a slew rate of the output buffer with a slew-rate control circuit connected between the break-before-make circuit and the output buffer, wherein the slew-rate control circuit comprises a first capacitor, a second capacitor connected to the first capacitor, and a feedback element connected to the first capacitor and the second capacitor.

48. The method for low-power output control of a circuit of claim 46, wherein the break-before-make circuit further comprises a first capacitor connected in parallel with the second inverter and a second capacitor connected in parallel with the fifth inverter.

49. The method for low-power output control of a circuit of claim 46, wherein the output buffer comprises a PMOS driver connected to an NMOS driver.

50. The method for low-power output control of a circuit of claim 47, wherein the feedback element of the slew-rate control circuit is a resistor.

51. The method for low-power output control of a circuit of claim 46, wherein the current limited input amplifier comprises a first CMOS inverter having an input and an output and a second CMOS inverter having an input and an output, and the output of the first CMOS inverter is connected to the input of the second CMOS inverter.

52. The method for low-power output control of a circuit of claim 46, further comprising the step of providing an input bias with a comparator, wherein the comparator is connected to the break-before-make circuit.

53. A method for low-power output control of a circuit, comprising the steps of:

amplifying an input bias of the circuit with a current limited input amplifier;

outputting digital logic levels with an output buffer; and delaying a state change of the output buffer with a break-before-make circuit, wherein the break-before-make circuit comprises a first inverter connected to a NAND sate, a second inverter connected to the first inverter, a third inverter connected to the second inverter, a NOR sate connected to the third inverter, a fourth inverter connected to the NOR sate, a fifth inverter connected to the fourth inverter, and an sixth inverter connected to the fifth inverter, and the NAND gate is connected to the sixth inverter, whereby the break-before-make circuit is connected between the current limited input amplifier and the output buffer.

54. The method for low-power output control of a circuit of claim 53, further comprising the steps step of:
controlling a slew rate of the output buffer with a slew-rate control circuit connected between the current limited input amplifier and the output buffer, wherein the slew-rate control circuit comprises a first capacitor, a second capacitor connected to the first capacitor, and a feedback element connected to the first capacitor and the second capacitor.

55. The method for low-power output control of a circuit of claim 53, wherein the break-before-make circuit further comprises a first capacitor connected in parallel with the second inverter and a second capacitor connected in parallel with the fifth inverter.

56. The method for low-power output control of a circuit of claim 53, wherein the output buffer comprises a PMOS driver connected to an NMOS driver.

57. The method for low-power output control of a circuit of claim 54, wherein the feedback element of the slew-rate control circuit is a resistor.

58. The method for low-power output control of a circuit of claim 53, wherein the current limited input amplifier comprises a first CMOS inverter having an input and an output and a second CMOS inverter having an input and an output, and the output of the first CMOS inverter is connected to the input of the second CMOS inverter.

59. The method for low-power output control of a circuit of claim 53 further comprising the step of providing the input bias with a comparator, wherein the comparator is connected to the current limited input amplifier.

* * * * *